(12) United States Patent
Jin

(10) Patent No.: US 12,142,585 B2
(45) Date of Patent: *Nov. 12, 2024

(54) DEVICES AND METHODS FOR ENHANCING INSERTION LOSS PERFORMANCE OF AN ANTENNA SWITCH

(71) Applicant: Taiwan Semiconductor Manufacturing Co., Ltd., Hsin-Chu (TW)

(72) Inventor: Jun-De Jin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/387,801

(22) Filed: Nov. 7, 2023

(65) Prior Publication Data

US 2024/0071961 A1    Feb. 29, 2024

Related U.S. Application Data

(60) Division of application No. 17/713,907, filed on Apr. 5, 2022, now Pat. No. 11,855,012, which is a
(Continued)

(51) Int. Cl.
*H01L 23/66* (2006.01)
*H01L 23/528* (2006.01)
(Continued)

(52) U.S. Cl.
CPC ............ *H01L 23/66* (2013.01); *H01L 23/528* (2013.01); *H01L 27/088* (2013.01);
(Continued)

(58) Field of Classification Search
CPC ..... H01L 23/66; H01L 23/528; H01L 27/088; H01L 29/0603; H01L 29/0692; H01L 29/417

See application file for complete search history.

(56) References Cited

U.S. PATENT DOCUMENTS

| 8,178,908 | B2 | 5/2012 | Greenberg et al. |
| 8,895,413 | B2 | 11/2014 | Pinguet et al. |
| 8,912,070 | B2 * | 12/2014 | Ma .................... H01L 29/78 |
| | | | 438/301 |
| 9,954,088 | B2 | 4/2018 | Bera et al. |
| 10,861,804 | B2 | 12/2020 | Jin |

(Continued)

FOREIGN PATENT DOCUMENTS

| CN | 102379037 A | 3/2012 |
| CN | 103426915 A | 12/2013 |
| CN | 103594496 A | 2/2014 |

OTHER PUBLICATIONS

Tinella, C. et al., "A 0.7dB Insertion Loss CMOS—SOI Antenna Switch with more than 50dB Isolation over the 2.5 to 5GHz Band", IEEE ESSCIRC, Sep. 2002, pp. 483-486.

(Continued)

*Primary Examiner* — Marc Anthony Armand
(74) *Attorney, Agent, or Firm* — Duane Morris LLP

(57) ABSTRACT

Devices and methods for enhancing insertion loss performance of an antenna switch are disclosed. In one example, a semiconductor device formed to serve as an antenna switch is disclosed. The semiconductor device includes: a substrate, a dielectric layer and a polysilicon region. The substrate includes: an intrinsic substrate; a metal-oxide-semiconductor device extending into the intrinsic substrate; and at least one isolation feature extending into and in contact with the intrinsic substrate. The at least one isolation feature is disposed adjacent to the metal-oxide-semiconductor device.

20 Claims, 4 Drawing Sheets

Related U.S. Application Data continuation of application No. 17/111,343, filed on Dec. 3, 2020, now Pat. No. 11,335,654, which is a continuation of application No. 16/364,439, filed on Mar. 26, 2019, now Pat. No. 10,861,804.

(60) Provisional application No. 62/649,967, filed on Mar. 29, 2018.

(51) Int. Cl.
  *H01L 27/088* (2006.01)
  *H01L 29/06* (2006.01)
  *H01L 29/417* (2006.01)

(52) U.S. Cl.
  CPC ...... *H01L 29/0603* (2013.01); *H01L 29/0692* (2013.01); *H01L 29/417* (2013.01)

(56) References Cited

U.S. PATENT DOCUMENTS

| | | |
|---|---|---|
| 2004/0232461 A1 | 11/2004 | Huang |
| 2009/0278207 A1 | 11/2009 | Greenberg et al. |
| 2010/0246152 A1* | 9/2010 | Lin ............ H01L 23/481 361/783 |
| 2014/0048765 A1 | 2/2014 | Ma et al. |
| 2015/0014786 A1 | 1/2015 | Jin et al. |
| 2016/0111488 A1 | 4/2016 | Lu et al. |
| 2017/0117358 A1 | 4/2017 | Kim et al. |

OTHER PUBLICATIONS

Gacim, F. et al., "Accurate modelling and optimization of inhomogenous substrate related losses in SPOT switch IC design for WLAN applications," IEEE Radio Frequency Integrated Circuits Symposium, Jun. 2017, RM02B-1, pp. 128-131.

* cited by examiner

DEVICES AND METHODS FOR ENHANCING INSERTION LOSS PERFORMANCE OF AN ANTENNA SWITCH

CROSS-REFERENCE TO RELATED APPLICATIONS

This application is a division of U.S. patent application Ser. No. 17/713,907, filed Apr. 5, 2022, which is a continuation of U.S. patent application Ser. No. 17/111,343, filed on Dec. 3, 2020, which is a continuation of U.S. patent application Ser. No. 16/364,439, filed on Mar. 26, 2019, now U.S. Pat. No. 10,861,804, which claims priority to U.S. Provisional Patent Application No. 62/649,967, filed on Mar. 29, 2018, each of which is incorporated by reference herein in their entireties.

BACKGROUND

A radio frequency (RF) switch or antenna switch is a key component in an antenna circuit of a wireless communication system to route high frequency signals through transmission paths. Cell phones and other wireless systems that contain multiple radios and multiple antennas often share some of the antennas to reduce system clutter. The antenna switches allow the power amplifier outputs to select the best antenna for a frequency band the system needs. In addition, the switches can prevent two radios from simultaneously trying to transmit at the same antenna. Antenna switches can be implemented in various technologies, e.g. mechanical structures such as subminiature relays and micro-electromechanical (MEMS) switches, gallium-arsenide (GaAs) or complementary metal-oxide-semiconductor (CMOS) field-effect transistor (FET) switches.

Insertion loss (IL) is a key performance indicator (KPI) for antenna switches. For example, losses greater than 1 or 2 dB will attenuate peak signal levels and increase rising and falling edge times. As wireless protocol develops to the fifth generation (5G) of cellular mobile communications, operation frequency becomes higher, e.g. at 28 GHz for a 5G network compared to 1-4 GHz for 2G to 4G networks. Existing techniques for improving IL performance, e.g. changing a normal silicon substrate to a high-resistivity one or deepening the trench isolation in the substrate, are not available for the CMOS technology with a 28 GHz operation frequency.

Thus, existing devices and methods for improving insertion loss performance are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
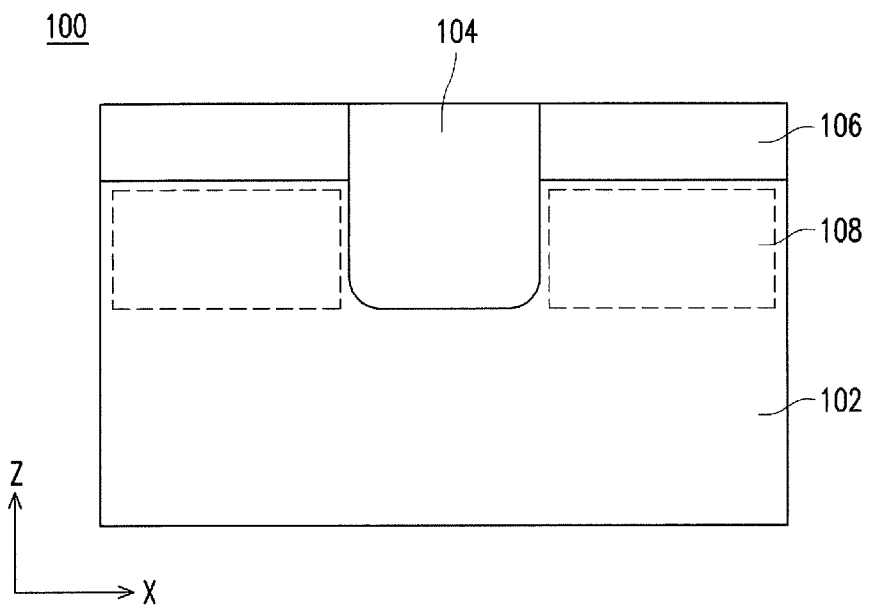
FIG. 1 illustrates a cross-sectional view of an exemplary semiconductor device formed to serve as an antenna switch, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

One goal of the present disclosure is to improve insertion loss (IL) performance of an antenna switch without changing a circuit design of the antenna switch. In one embodiment, a doped well, e.g. a p-type well or a n-type well, adjacent to a metal-oxide-semiconductor (MOS) device in the substrate is removed and replaced with a non-doped silicon region to improve IL performance. In another embodiment, a point-shape contact is used for the antenna switch to improve IL performance. In yet another embodiment, a total length along a direction of a group of transistors connected in parallel along the direction is reduced or minimized to improve IL performance, e.g. by minimizing the number of the transistors to remove spacing between adjacent transistors. Each transistor may include multiple gate fingers, while the minimization does not change a total finger width of the transistors according to a design requirement. In a different embodiment, additional metal layers are stacked on transistors of the antenna switch in the chip region and/or the packaging region to improve IL performance.

Each of the above-mentioned embodiments can improve IL performance of an antenna switch based on a process technique without changing a circuit design of the antenna switch. The above-mentioned embodiments may be applied independently or in any combination. They can improve IL performance without incurring any additional cost or any additional process complexity, or chip area penalty. The present disclosure is applicable to any semiconductor process technology for antenna switch, including but not limited to the fin field-effect transistor (FinFET) which is the next technology for 28 GHz 5G cellular networks.

FIG. 1 illustrates a cross-sectional view of an exemplary semiconductor device 100 formed to serve as an antenna switch, in accordance with some embodiments of the present disclosure. As shown in FIG. 1, the semiconductor device 100 includes a substrate 102, a MOS device 104, e.g. a transistor, extending into the substrate 102 along the −Z direction, and at least one isolation feature 106 extending into the substrate 102 along the −Z direction. The at least one isolation feature 106 is disposed adjacent to the MOS device 104 along the X direction. In one embodiment, the at least one isolation feature 106 comprises a shallow trench isolation (STI).

In one embodiment, the substrate 102 is an intrinsic substrate that includes a pure semiconductor, e.g. non-doped silicon, without any significant dopant species present. As such, there is no p-type well or n-type well in the substrate 102. In another embodiment, the substrate 102 comprises at least one non-doped silicon region 108, adjacent to the MOS device 104 along the X direction. Each of the at least one non-doped silicon region 108 may have a length between about 20 micrometers and 200 micrometers along the X direction. That is, the at least one non-doped silicon region 108 surrounding the MOS device 104 extends at least 20 micrometers from the MOS device 104. Again in this case, there is no p-type well or n-type well in the at least one non-doped silicon region 108 of the substrate 102.

The substrate 102, including the at least one non-doped silicon region 108, comprises a semiconductor material, e.g. silicon, that has a higher impedance than that of an extrinsic semiconductor, e.g. a p-type semiconductor or a n-type semiconductor. As such, compared to an antenna switch with p-type well or n-type well surrounding the MOS device 104, the semiconductor device 100 disclosed in FIG. 1 has a higher substrate impedance that leads to a reduced parasitic loss of the MOS transistor 104. This reduces the amount of RF leakage through the substrate 102, which in turn improves the IL performance of the antenna switch 100.

According to one experiment result, a traditional antenna switch having a p-type well surrounding the transistor 104 induces an IL of 1.65 dB. In contrast, the antenna switch 100 having a non-doped silicon surrounding the transistor 104 reduces the IL to 1.18 dB, i.e. improving the IL performance by 0.47 dB compared to the traditional antenna switch.

According to the same experiment result, the traditional antenna switch induces a second order IL of −41 dBm. In contrast, the antenna switch 100 reduces the second order IL to −45 dBm, i.e. improving the second order IL performance by 4 dBm compared to the traditional antenna switch.

According to the same experiment result, the traditional antenna switch induces a third order IL of −50 dBm. In contrast, the antenna switch 100 reduces the third order IL to −64 dBm, i.e. improving the third order IL performance by 14 dBm compared to the traditional antenna switch.

According to the same experiment result, the traditional antenna switch has an isolation (ISO) of 15.1 dB, while the antenna switch 100 has an ISO of 14.8 dB. ISO is a degree of attenuation from an unwanted signal detected at the port of interest in an antenna switch. As such, compared to the traditional antenna switch, the antenna switch 100 can improve IL performance without changing much the ISO performance.

Figure 2:
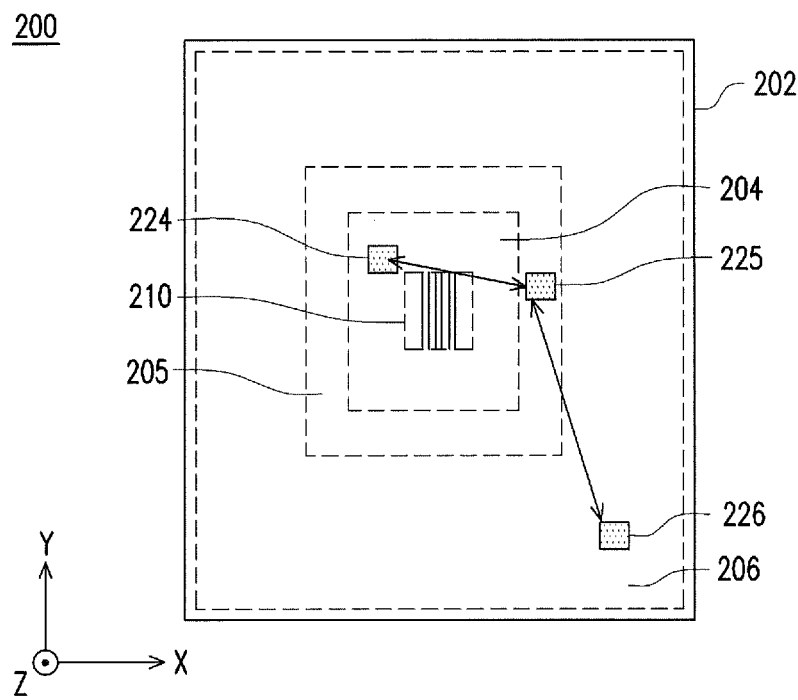
FIG. 2 illustrates a top view of another exemplary semiconductor device formed to serve as an antenna switch, in accordance with some embodiments of the present disclosure.

FIG. 2 illustrates a top view of another exemplary semiconductor device 200 formed to serve as an antenna switch, in accordance with some embodiments of the present disclosure. As shown in FIG. 2, the semiconductor device 200 in this example includes a substrate 202, a MOS device 210, e.g. a transistor, extending into the substrate 202, and a plurality of contact pads 224, 225, 226 exposed on a surface of the substrate 202.

In one embodiment, the substrate 202 comprises a plurality of regions 204, 205, 206 each of which has a ring shape. Each of the plurality of contact pads 224, 225, 226 corresponds to one of the plurality of regions 204, 205, 206 and has a point-based shape covering a portion of the ring shape of the corresponding region. In one example, each of the plurality of contact pads 224, 225, 226 has a width between about 0.1 micrometer and 2 micrometers. That is, each of the plurality of contact pads 224, 225, 226 may have an area smaller than 4 square micrometers. The plurality of contact pads 224, 225, 226 may be located at the outside diameter (OD), metal 1 (M1), n+ polysilicon, and/or p+ polysilicon layers.

As shown in FIG. 2, the plurality of regions in the substrate 202 comprises: a p-type or n-type well region 204 in which a first contact pad 224 is located, a deep n-type well region 205 in which a second contact pad 225 is located, and a p-type substrate region 206 in which a third contact pad 226 is located. In one example, a distance from the first contact pad 224 to the second contact pad 225 is between 0.01 micrometer and 5 micrometers. In another example, a distance from the second contact pad 225 to the third contact pad 226 is between 0.01 micrometer and 200 micrometers.

Substrate coupling in an integrated circuit (IC) is the process where a parasitic current flow in the substrate creates an electrical coupling between devices and/or circuits due to the presence of conductive and capacitive paths in the silicon substrate. The capacitance between interconnect (e.g. wires, contact pads 224, 225, 226) and the substrate delays the signal through the interconnection. In the example of FIG. 2, the current flowing to ground through the substrate 202 can cause a voltage drop, which affects the IL performance of the antenna switch 200. Compared to a traditional antenna switch with ring-shape contact pads, the antenna switch 200 with point-shape contact pads 224, 225, 226 reduces the parasitic capacitance to the substrate due to a smaller area of the point-shape contact pads compared to the ring-shape contact pads. As such, the antenna switch 200 will have less RF leakage through the substrate 202 and hence a better IL performance than the traditional antenna switch with ring-shape contact pads.

Figure 3:
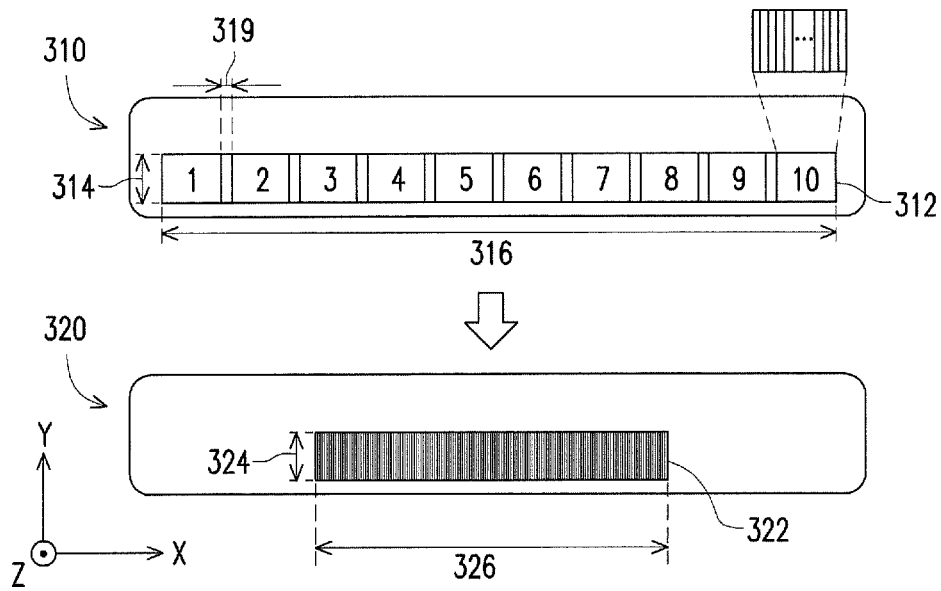
FIG. 3 illustrates top views of exemplary semiconductor devices each formed to serve as an antenna switch, in accordance with some embodiments of the present disclosure.

FIG. 3 illustrates top views of exemplary semiconductor devices 310, 320 each formed to serve as an antenna switch, in accordance with some embodiments of the present disclosure. As shown in FIG. 3, the antenna switch 310 in this example includes ten transistors 312 connected in parallel along the X direction. Each of the ten transistors 312 comprises a plurality of gate fingers. In this example, each of the ten transistors 312 has a multi-finger structure with 24 gate fingers. Each of the gate fingers in the ten transistors 312 has a finger width FW1 314 extending along the Y direction orthogonal to the X direction. In this example, each of the gate fingers in the ten transistors 312 has a finger width FW1 equal to 2 micrometers. As such, the ten transistors 312 has a total gate finger width (Wg) equal to a sum of all finger widths of all gate fingers of the ten transistors 312. That is, Wg is 480 micrometers=2 micrometers*24 fingers/transistor*10 transistors-connected-in-parallel. Because a transistor having N fingers connected in parallel with each finger having a finger width W have an effective finger width of NW, the Wg=480 micrometers is an effective total finger width of the antenna switch 310. The ten transistors 312 have a total length L1 316 along the X direction.

In contrast, the antenna switch 320 in this example includes one transistor 322 that comprises a plurality of gate fingers. The transistor 322 has a total length L2 326 along the X direction. In this example, the transistor 322 has a multi-finger structure with 240 gate fingers. Each of the 240 gate fingers in the transistor 322 has a finger width FW2 324 extending along the Y direction orthogonal to the X direction. In this example, each of the gate fingers in the transistor 322 has a finger width FW2 equal to 2 micrometers. As such, the transistor 322 has a total gate finger width (Wg) equal to a sum of all finger widths of all gate fingers of the transistor 322. That is, Wg is 480 micrometers=2 micrometers*240 fingers/transistor*1 transistor. Because a transistor having N fingers connected in parallel with each finger having a finger width W have an effective finger width of NW, the Wg=480 micrometers is an effective total finger width of the antenna switch 320. As such, the antenna switch 320 has the same effective total gate finger width Wg as the antenna switch 310. An effective total gate finger width Wg is often determined based on a design requirement.

Compared to the antenna switch 310, the antenna switch 320 has a less number of transistors (reduced from 10 to 1) but a larger number of fingers per transistor (increased from 24 to 240). That is, the number of transistors in the antenna switch 320 is minimized without changing the total gate finger width Wg and without changing the design requirement. In this embodiment in FIG. 3, the number of transistors in the antenna switch 320 is minimized to one. In another embodiment, the number of transistors may be reduced to remove spacing between at least two adjacent transistors, but not being minimized to one.

As shown in FIG. 3, the antenna switch 310 has a spacing 319 between adjacent transistors connected in parallel. The antenna switch 320 minimizes the number of transistors to remove the spacing 319 between adjacent transistors as much as possible without changing the total gate finger width Wg. In this manner, a total length of the transistor(s) along the X direction is reduced and minimized. As shown in FIG. 3, the ten transistors 312 has a total length L1 316 along the X direction, while the transistor 322 has a total length L2 326 along the X direction. The total length L2 326 is shorter than the total length L1 316.

In one embodiment, a first wire or electric line (not shown in FIG. 3) connects to the ten transistors 312 along the Y direction; while a second wire or electric line (not shown in FIG. 3) connects to the transistor 322 along the Y direction. Since both the first wire and the second wire are very thin, their thicknesses along the X direction are shorter than the total length L1 316 and the total length L2 326. That is, in both the antenna switch 310 and the antenna switch 320, the wire connecting to an interface of the transistor(s) is thinner than the interface, which can cause parasitic capacitance. By minimizing the number of transistor(s) and minimizing the total length of the transistor(s), the antenna switch 320 has a minimized total length L2 326 that is closer to the thickness of the connecting wire compared to the total length L1 316 of the antenna switch 310. As such, compared to a traditional antenna switch without minimizing the number or total length of the transistors connected in parallel, the antenna switch 320 with minimized number of transistors and minimized total length L2 326 reduces the parasitic capacitance between the connecting wires and the transistors due to a better matched interface between the connecting wires and the transistors. As such, the antenna switch 320 will have less RF leakage and a better IL performance than the traditional antenna switch.

According to one experiment result, the antenna switch 310 without minimizing the number or total length of the transistors connected in parallel induces an IL of 0.73 dB. In contrast, the antenna switch 320 with minimized number of transistors and minimized total length reduces the IL to 0.60 dB, i.e. improving the IL performance by 0.13 dB compared to the antenna switch 310.

According to the same experiment result, the antenna switch 310 without minimizing the number or total length of the transistors connected in parallel induces an ISO of 2.5 dB, while the antenna switch 320 with minimized number of transistors and minimized total length also has an ISO of 2.5 dB. ISO is a degree of attenuation from an unwanted signal detected at the port of interest in an antenna switch. As such, compared to the antenna switch 310, the antenna switch 320 can improve IL performance without changing the ISO performance.

While multiple transistors connected in parallel are commonly used for a low noise amplifier (LNA) and a power amplifier (PA) in consideration of heat sink issue therein, an antenna switch does not need the multi-transistor structure since heat sink is not an issue for antenna switch. As such, by minimizing the number and the total length of the transistor(s), the antenna switch can achieve both a better IL performance and a more compact chip area.

Figure 4:
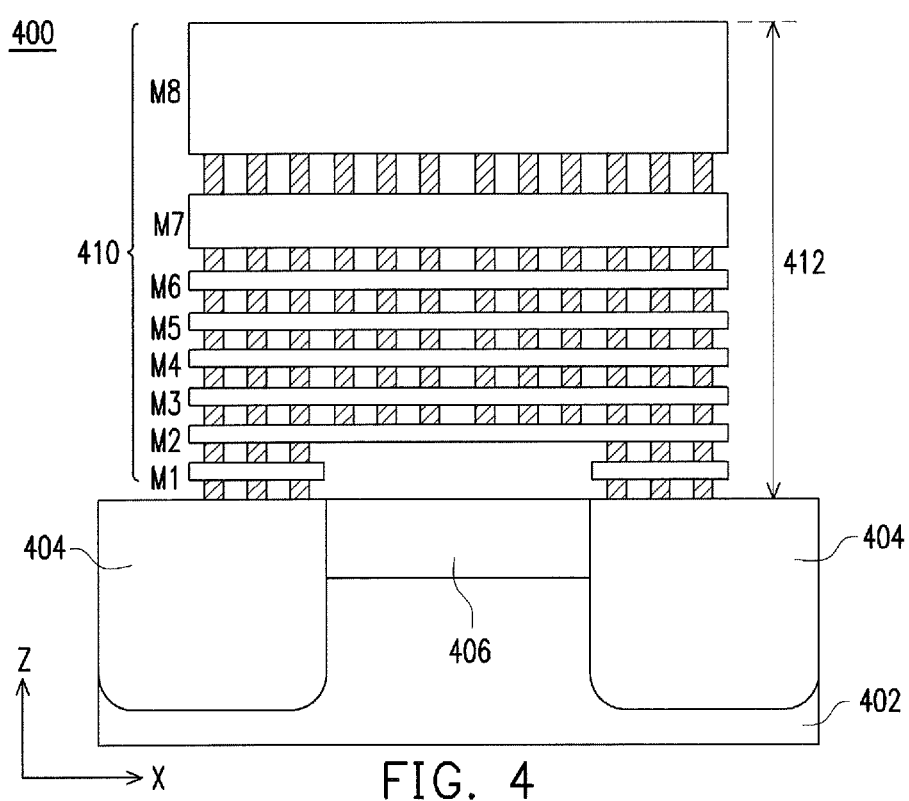
FIG. 4 illustrates a cross-sectional view of a chip portion of an exemplary semiconductor device formed to serve as an antenna switch, in accordance with some embodiments of the present disclosure.

FIG. 4 illustrates a cross-sectional view of a chip portion of an exemplary semiconductor device 400 formed to serve as an antenna switch, in accordance with some embodiments of the present disclosure. As shown in FIG. 4, the semiconductor device 400 includes a substrate 402, at least one MOS device 404, e.g. a transistor, extending into the substrate 402 along the —Z direction, and at least one isolation feature 406 extending into the substrate 402 along the —Z direction. Each of the at least one isolation feature 406 is disposed between two adjacent MOS devices 104 along the X direction to isolate the two adjacent MOS devices 104. In one embodiment, each of the at least one isolation feature 406 comprises a shallow trench isolation (STI).

As shown in FIG. 4, the semiconductor device 400 includes a plurality of metal layers 410 stacked on the MOS transistors 404, e.g. on the source and drain sides of the MOS transistors 404. The plurality of metal layers 410 are connected to the MOS transistors 404 in parallel, while a current flow goes through the MOS transistors 404 along the X direction. The more metal layers stacked on the MOS transistors 404, the higher percentage of input signal can go through the MOS transistors 404, i.e. the larger the forward voltage gain of the MOS transistors 404. In other words, as the number of metal layers 410 increases, a larger percentage of input signal will go through the MOS transistors 404, and only a smaller percentage of the input signal can leak through the substrate 402, which improves the IL performance of the semiconductor device 400.

In the embodiment shown in FIG. 4, there are eight thick metal layers M1 to M8 stacked on the MOS transistors 404. The eight metal layers M1 to M8 has a total thickness T 412 along the Z direction. In one example, the total thickness T 412 is about 6.5 micrometers. According to various embodiments, the quantity of the metal layers stacked on the MOS transistors in the chip portion may be between four and twenty.

According to one experiment result, a traditional antenna switch having three metal layers in the chip region induces an IL of 1.69 dB. In contrast, the antenna switch 400 having eight metal layers in the chip region reduces the IL to 1.54 dB, i.e. improving the IL performance by 0.15 dB, or about 10%, compared to the traditional antenna switch.

According to the same experiment result, the traditional antenna switch has an isolation (ISO) of 14.9 dB, while the antenna switch 400 has an ISO of 14.6 dB. ISO is a degree of attenuation from an unwanted signal detected at the port of interest in an antenna switch. As such, compared to the traditional antenna switch, the antenna switch 400 can improve IL performance without changing much the ISO performance.

Figure 5:
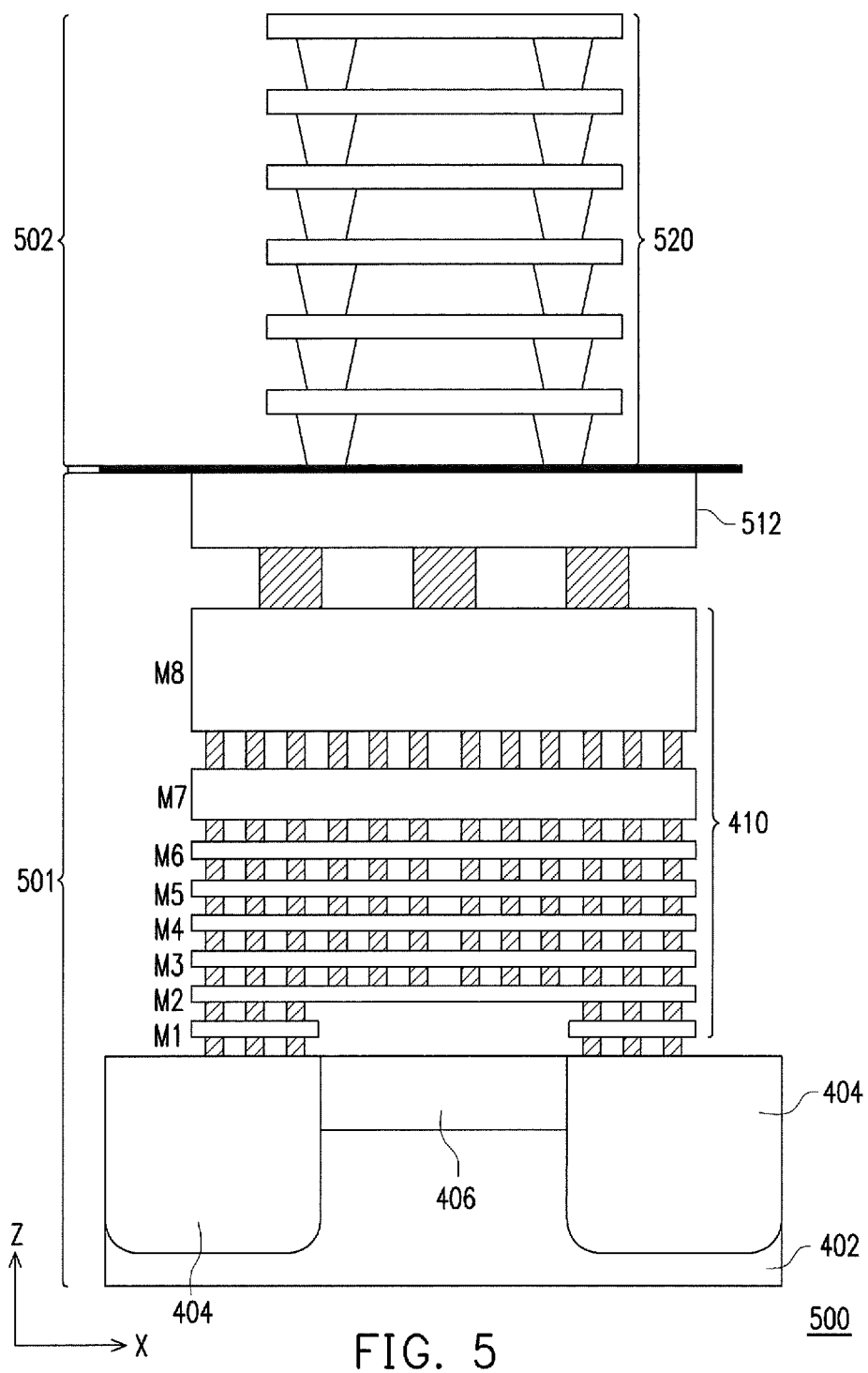
FIG. 5 illustrates a cross-sectional view of both a chip portion and a packaging portion of an exemplary semiconductor device formed to serve as an antenna switch, in accordance with some embodiments of the present disclosure.

It is also helpful to stack more metal layers in the packaging region of an antenna switch. FIG. 5 illustrates a cross-sectional view of both a chip portion and a packaging portion of an exemplary semiconductor device 500 formed to serve as an antenna switch, in accordance with some embodiments of the present disclosure. As shown in FIG. 5, the semiconductor device 500 includes a chip portion 501 and a packaging portion 502 disposed on the chip portion 501. The chip portion 501 in this example comprises all components of the semiconductor device 400 as shown in FIG. 4, as well as a redistribution layer (RDL) 512 disposed on top of the metal layers 410 along the Z direction.

As shown in FIG. 5, the packaging portion 502 of the semiconductor device 500 includes a plurality of metal layers 520 stacked above the RDL 512. The plurality of metal layers 520 are connected to metal layers 410 in parallel, and are thus connected to the MOS transistors 404 in parallel as well, while a current flow goes through the MOS transistors 404 along the X direction. The more metal layers stacked in the packaging portion 502, the higher percentage of input signal can go through the MOS transistors 404, i.e. the larger the forward voltage gain of the MOS transistors 404. In other words, as the number of metal layers 520 increases, a larger percentage of input signal will go through the MOS transistors 404, and only a smaller percentage of the input signal can leak through the substrate 402, which improves the IL performance of the semiconductor device 500.

In the embodiment shown in FIG. 5, there are six thick metal layers stacked in the packaging portion 502. According to various embodiments, the quantity of the metal layers stacked in the packaging portion 502 may be between four and twenty.

Figure 6:
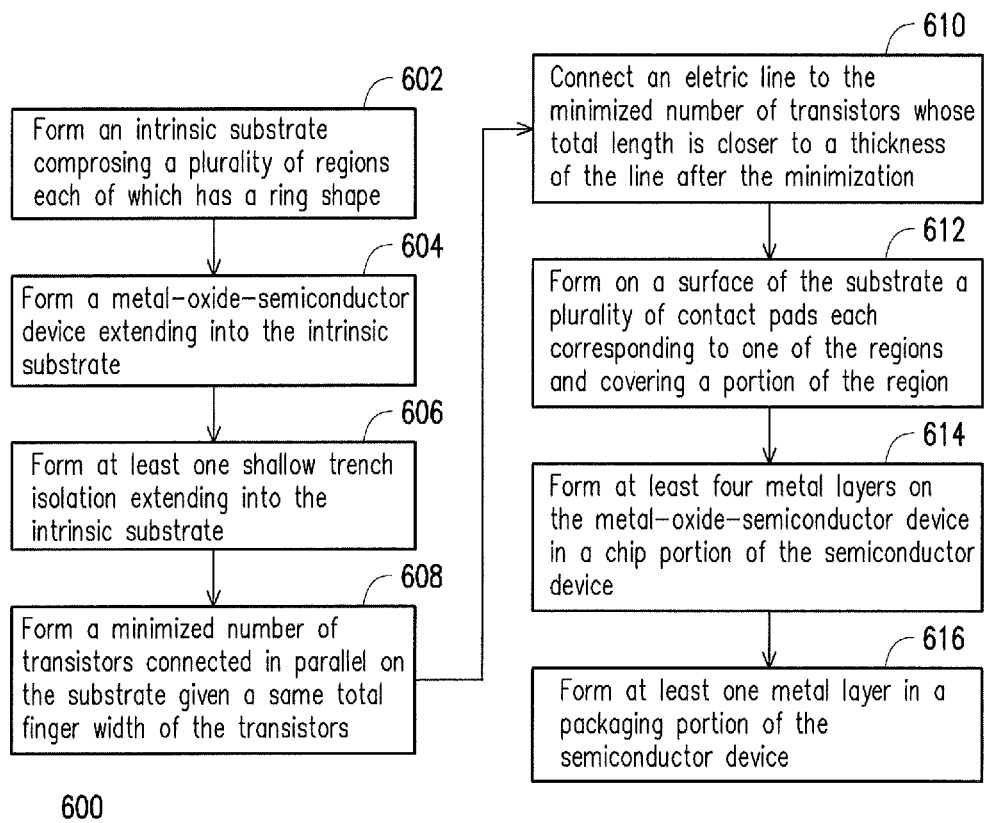
FIG. 6 shows a flow chart illustrating an exemplary method for forming a semiconductor device to serve as an antenna switch, in accordance with some embodiments of the present disclosure.

FIG. 6 shows a flow chart illustrating an exemplary method 600 for forming a semiconductor device to serve as an antenna switch, in accordance with some embodiments of the present disclosure. At operation 602, an intrinsic substrate is formed. The intrinsic substrate comprises a plurality of regions each of which has a ring shape. A metal-oxide-semiconductor (MOS) device is formed at operation 604 extending into the intrinsic substrate. At least one shallow trench isolation is formed at operation 606 extending into the intrinsic substrate. A minimized number of transistors connected in parallel is formed at operation 608 on the substrate given a same total finger width of the transistors. At operation 610, an electric line or wire is connected to the minimized number of transistors whose total length is closer to a thickness of the line after the minimization. A plurality of contact pads is formed at operation 612 on a surface of the substrate. Each of the plurality of contact pads corresponds to one of the regions and covers a portion of the region, e.g. a point-shape portion of the ring-shape region. At operation 614, at least four metal layers are formed on the MOS device in a chip portion of the semiconductor device. At operation 616, at least one metal layer is formed in a packaging portion of the semiconductor device. The order of the steps shown in FIG. 6 may be changed according to different embodiments of the present disclosure.

In an embodiment, a semiconductor device formed to serve as an antenna switch is disclosed. The semiconductor device includes: a substrate, a dielectric layer and a polysilicon region. The substrate includes: an intrinsic substrate; a metal-oxide-semiconductor device extending into the intrinsic substrate; and at least one isolation feature extending into and in contact with the intrinsic substrate. The at least one isolation feature is disposed adjacent to the metal-oxide-semiconductor device.

In another embodiment, a semiconductor device formed to serve as an antenna switch is disclosed. The semiconductor structure includes: a substrate comprising a plurality of regions each of which has a ring shape; a metal-oxide-semiconductor device extending into the substrate; and a plurality of contact pads exposed on a surface of the substrate. Each of the plurality of contact pads corresponds to one of the plurality of regions and has a shape covering a portion of the ring shape of the corresponding region.

In yet another embodiment, a semiconductor device formed to serve as an antenna switch is disclosed. The semiconductor device includes a first number of at least one transistor that are connected in parallel along a first direction when the first number is greater than one. Each of the at least one transistor comprises a plurality of gate fingers. Each of the plurality of gate fingers has a finger width extending along a second direction orthogonal to the first direction. The at least one transistor has a total finger width equal to a sum of all finger widths of all gate fingers of the at least one transistor. The first number is reduced to remove spacing between at least two adjacent transistors given the same total finger width.

In still another embodiment, a semiconductor device formed to serve as an antenna switch is disclosed. The semiconductor device includes: a substrate; a metal-oxide-semiconductor device extending into the substrate; at least one isolation feature extending into the substrate and disposed adjacent to the metal-oxide-semiconductor device;

and at least four metal layers disposed on the metal-oxide-semiconductor device in a chip portion of the semiconductor device.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device formed to serve as an antenna switch, comprising:
    a substrate comprising a plurality of regions;
    a metal-oxide-semiconductor device extending into the substrate; and
    a plurality of contact pads exposed on a surface of the substrate, wherein each of the plurality of contact pads corresponds to one of the plurality of regions,
    wherein the plurality of regions comprises at least one of: a p-type well region corresponding to a first contact pad, a deep n-type well region corresponding to a second contact pad, and a p-type substrate region corresponding to a third contact pad.

2. The semiconductor device of claim 1, wherein each of the plurality of contact pads has an area smaller than 4 square micrometers.

3. The semiconductor device of claim 2, wherein each of the plurality of regions has a ring shape and each of the plurality of contact pads has a shape covering a portion of the ring shape of the corresponding region.

4. The semiconductor device of claim 1, wherein:
    a distance from the first contact pad to the second contact pad is between 0.01 micrometer and 5 micrometers.

5. The semiconductor device of claim 1, wherein:
    a distance from the second contact pad to the third contact pad is between 0.01 micrometer and 200 micrometers.

6. A semiconductor device, comprising:
    a substrate comprising a plurality of regions;
    a metal-oxide-semiconductor device extending into the substrate; and
    a plurality of contact pads on a surface of the substrate, wherein each of the plurality of contact pads corresponds to one of the plurality of regions,
    wherein the plurality of regions comprises at least one of: a p-type well region corresponding to a first contact pad, a deep n-type well region corresponding to a second contact pad, and a p-type substrate region corresponding to a third contact pad.

7. The semiconductor device of claim 6, wherein each of the plurality of contact pads has an area smaller than 4 square micrometers.

8. The semiconductor device of claim 7, wherein each of the plurality of regions has a ring shape and each of the plurality of contact pads has a shape covering a portion of the ring shape of the corresponding region.

9. The semiconductor device of claim 6, wherein a distance from the first contact pad to the second contact pad is larger than 0.01 micrometer.

10. The semiconductor device of claim 6, wherein a distance from the first contact pad to the second contact pad is smaller than 5 micrometers.

11. The semiconductor device of claim 6, wherein a distance from the second contact pad to the third contact pad is larger than 0.01 micrometer.

12. The semiconductor device of claim 6, wherein a distance from the second contact pad to the third contact pad is smaller than 200 micrometers.

13. The semiconductor device of claim 6, wherein the semiconductor device serves as an antenna switch.

14. A semiconductor device, comprising:
    a substrate comprising a plurality of regions,
    wherein the plurality of regions comprises at least one of: a p-type well region corresponding to a first contact pad, a deep n-type well region corresponding to a second contact pad, and a p-type substrate region corresponding to a third contact pad;
    a metal-oxide-semiconductor device extending into the substrate; and
    at least one isolation feature extending into the substrate and disposed adjacent to the metal-oxide-semiconductor device.

15. The semiconductor device of claim 14, comprising forming at least four metal layers on the metal-oxide-semiconductor device in a chip portion of the semiconductor device.

16. The semiconductor device of claim 15, wherein a quantity of the at least four metal layers is between four and twenty.

17. The semiconductor device of claim 16, wherein an insertion loss of the semiconductor device is smaller as a quantity of the at least four metal layers becomes larger.

18. The semiconductor device of claim 15, wherein eight metal layers in total are formed on the metal-oxide-semiconductor device in the chip portion of the semiconductor device.

19. The semiconductor device of claim 14, further comprising:
    forming at least one metal layer in a packaging portion of the semiconductor device.

20. The semiconductor device of claim 19, wherein an insertion loss of the semiconductor device is smaller as a quantity of the at least one metal layer becomes larger.

* * * * *